US012546029B2

(12) United States Patent
Nishioka et al.

(10) Patent No.: US 12,546,029 B2
(45) Date of Patent: Feb. 10, 2026

(54) SYSTEM AND METHOD FOR PRODUCING SINGLE CRYSTAL

(71) Applicant: SUMCO Corporation, Tokyo (JP)

(72) Inventors: Kenichi Nishioka, Tokyo (JP); Keiichi Takanashi, Tokyo (JP)

(73) Assignee: SUMCO Corporation, Tokyo (JP)

( * ) Notice: Subject to any disclaimer, the term of this patent is extended or adjusted under 35 U.S.C. 154(b) by 785 days.

(21) Appl. No.: 17/785,379

(22) PCT Filed: Oct. 30, 2020

(86) PCT No.: PCT/JP2020/040830
§ 371 (c)(1),
(2) Date: Jun. 14, 2022

(87) PCT Pub. No.: WO2021/124708
PCT Pub. Date: Jun. 24, 2021

(65) Prior Publication Data
US 2023/0023541 A1 Jan. 26, 2023

(30) Foreign Application Priority Data
Dec. 18, 2019 (JP) ................................ 2019-228321

(51) Int. Cl.
*C30B 15/22* (2006.01)
*C30B 29/06* (2006.01)
*G06Q 50/04* (2012.01)

(52) U.S. Cl.
CPC .............. *C30B 15/22* (2013.01); *C30B 29/06* (2013.01); *G06Q 50/04* (2013.01)

(58) Field of Classification Search
CPC .......... C30B 15/22; C30B 15/26; C30B 29/06
See application file for complete search history.

(56) References Cited

U.S. PATENT DOCUMENTS 5,653,799 A 8/1997 Fuerhoff
5,665,159 A * 9/1997 Fuerhoff ................ C30B 15/26 117/14

(Continued)

FOREIGN PATENT DOCUMENTS

JP 63242992 A * 10/1988 ............ C30B 15/28
JP S63-242992 A 10/1988

(Continued)

OTHER PUBLICATIONS

English computer translation of JP-63242992-A (Year: 2025).*

(Continued)

*Primary Examiner* — Matthew J Song
(74) *Attorney, Agent, or Firm* — Christensen O'Connor Johnson Kindness PLLC

(57) ABSTRACT

A system and method for producing a single crystal can prevent calculation and setting mistakes and provide an adequate correction amount in the next batch. A single crystal manufacturing system includes a pulling-up apparatus that calculates a diameter measurement value of a single crystal during a pulling-up process, calculates a first diameter of the single crystal by correcting the diameter measurement value using a diameter correction coefficient, and controls crystal pulling-up conditions based on the first diameter. A diameter measuring apparatus measures a diameter of the single crystal pulled up by the pulling-up apparatus to calculate a second diameter of the single crystal. A database server acquires the first diameter and the second diameter. The database server calculates a correction amount of the diameter correction coefficient from the first and second diameters obtained at diameter measurement positions which coincide with each other under room temperature.

8 Claims, 6 Drawing Sheets

1

(56) References Cited

U.S. PATENT DOCUMENTS

| | | | |
|---|---|---|---|
| 2010/0128253 A1 | 5/2010 | Yanagimachi et al. | |
| 2018/0355509 A1* | 12/2018 | Samanta | C30B 15/30 |

FOREIGN PATENT DOCUMENTS

| | | |
|---|---|---|
| JP | H08-333197 A | 12/1996 |
| JP | 2005-162558 A | 6/2005 |
| JP | 2009-057236 A | 3/2009 |

OTHER PUBLICATIONS

International Search Report mailed Jan. 12, 2021, issued in corresponding International Application No. PCT/JP2020/040830, filed Oct. 30, 2020, 2 pages.

* cited by examiner

SYSTEM AND METHOD FOR PRODUCING SINGLE CRYSTAL

TECHNICAL FIELD

The present invention relates to a single crystal manufacturing system and method based on a Czochralski method (CZ method) and, more particularly, to a control system and a control method for the diameter of a single crystal.

BACKGROUND ART

Many silicon single crystals used as a substrate material of a semiconductor device are manufactured by a CZ method. In the CZ method, a polysilicon raw material is charged into a quartz crucible and heated in a chamber to generate a silicon melt. Then, a seed crystal is lowered from above the quartz crucible and is dipped into the silicon melt. Then, the seed crystal is gradually lifted up while being rotated together with the quartz crucible, whereby a large single crystal grows at the lower end of the seed crystal. According to the CZ method, the manufacturing yield of a large-diameter silicon single crystal can be improved.

A single crystal ingot is produced so as to have a target diameter. For example, when a finished product is a 300 mm wafer, it is common to produce a single crystal ingot having a diameter of 305 mm to 320 mm, which is slightly larger than the diameter of the wafer. Then, the single crystal ingot is ground at the outer circumference thereof so as to have a cylindrical shape, and is sliced into wafers. The wafer is then subjected to chamfering, and has an ultimate target wafer diameter. The target diameter of a single crystal ingot has to be larger than the wafer diameter of a finished product. However, an excessively large diameter increases grinding/polishing margin, making it uneconomical. Therefore, there is a demand for a single crystal ingot having a diameter which is larger than that of a wafer and is as small as possible.

In the CZ method, a single crystal is pulled up while controlling a pulling-up rate and heater power so as to obtain a constant crystal diameter. As to a control method for the diameter of a signal crystal, for example, Patent Document 1 describes a method that changes a pulling-up rate and heater power while estimating the diameter of the single crystal to be pulled up using an estimation scheme of a weight method or an optical method so as to control the diameter of the pulled-up single crystal. In this method, the diameter of a single crystal ingot is actually measured at a plurality of specific positions in the longitudinal direction of the ingot for each completion of pulling-up, and a correction value for diameter control is acquired by comparing the actually measured values with diameter estimation values at a plurality of the positions same as those at which the actually measured values have been obtained. The obtained correction value is used for estimation of a single crystal diameter at the next pulling-up process, or a plurality of correction values are integrated and used for estimating a single crystal diameter at each of a plurality of subsequent pulling-up processes.

Further, Patent Document 2 describes a method of detecting the diameter of a single crystal grown by the CZ method. In this method, the diameter of the single crystal is detected both by a camera and a load cell. The diameter detected by the camera is corrected based on the difference between the diameter detected by the camera and the diameter calculated from the load cell measurement and a correction coefficient previously determined based on the growth rate of the single crystal. The value obtained from this correction is determined as the diameter of the single crystal.

CITATION LIST

Patent Document

Patent Document 1: Japanese Patent Application Laid-Open No. S63-242992

Patent Document 2: Japanese Patent Application Laid-Open No. 2009-057236

SUMMARY OF THE INVENTION

Problem to be Solved by the Invention

In the measurement of the diameter of a single crystal, a new correction amount is calculated from the single crystal ingot for each completion of pulling-up, and the obtained correction amount is reflected in the next batch, whereby measurement accuracy for the crystal diameter can be increased. However, in this measurement, when an operator manually calculates a new correction amount and manually sets the correction amount to a single crystal pulling-up apparatus, calculation mistakes and setting mistakes may occur to reduce the manufacturing yield of a silicon single crystal. It is urgently required to reduce the burden of the operator who sets the correction amounts because the production amount of a single crystal ingot is increased recently by the enhanced production facilities.

The present invention has been made to solve the above problem, and an object of the present invention is to provide a single crystal manufacturing system and method capable of preventing calculation and setting mistakes with respect to the correction amount and reflecting an adequate correction amount in the next batch.

Means for Solving the Problems

To solve the above problem, a single crystal manufacturing system according to the present invention includes: a single crystal pulling-up apparatus that calculates a diameter measurement value of a single crystal during a pulling-up process of the single crystal according to a CZ method, calculates a first diameter of the single crystal by correcting the diameter measurement value using a diameter correction coefficient, and controls crystal pulling-up conditions based on the first diameter; a diameter measuring apparatus that measures, under room temperature, a diameter of the single crystal pulled up by the single crystal pulling-up apparatus to calculate a second diameter of the single crystal; and a database server that acquires the first diameter and the second diameter from the single crystal pulling-up apparatus and the diameter measuring apparatus, respectively, and manages them. The database server calculates a correction amount of the diameter correction coefficient from the first and second diameters obtained at diameter measurement positions which coincide with each other under room temperature and corrects the diameter correction coefficient using the calculated correction amount.

According to the present invention, the first diameter that the single crystal pulling-up apparatus calculates for crystal pulling-up control and the second diameter that the diameter measuring apparatus calculates for accurate measurement of the crystal diameter can be automatically collected, and a correction amount of the diameter correction coefficient used to correct the diameter measurement value can be automatically calculated from the first and second diameter values. This can prevent mistakes in the calculation of the correction amount due to operator's manual calculation and mistakes in the setting thereof, thereby allowing an adequate correction amount to be reflected in the next batch.

In the present invention, the crystal pulling-up apparatus preferably has a camera photographing a boundary between the single crystal and a melt during the single crystal pulling-up process and calculates the diameter measurement value of the single crystal from a photographed image of the camera. Further, the database server preferably sets the diameter correction coefficient after being corrected in the single crystal pulling-up apparatus, and the single crystal pulling-up apparatus preferably corrects the diameter measurement value of a single crystal in the next batch using the corrected diameter correction coefficient. Thus, in the single crystal pulling-up process according to the CZ method, a measurement error with respect to the diameter of the single crystal can be appropriately corrected.

In the present invention, the correction amount of the diameter correction coefficient is preferably a value obtained by multiplying the difference or ratio between the first and second diameters obtained at diameter measurement positions which coincide with each other under room temperature by a gain, and the gain is preferably more than 0 and equal to or less than 1 and particularly preferably equal to or less than 0.5. This can stably correct the correction coefficient required to correct the diameter measurement value so as to calculate the first diameter.

In the present invention, the single crystal pulling-up apparatus and the diameter measuring apparatus are preferably connected to the database server over a communication network. The single crystal pulling-up apparatus preferably transmits the first diameter of the single crystal, a diameter measurement position at which the first diameter is measured, and an ingot ID of the single crystal to the database server. The diameter measuring apparatus preferably transmits the second diameter of the single crystal, a diameter measurement position at which the second diameter is measured, and an ingot ID of the single crystal to the database server. The database server preferably registers the first diameter from the single crystal pulling-up apparatus and the second diameter from the diameter measuring apparatus in association with each other. This allows the first diameter calculated by the single crystal pulling-up apparatus and the second diameter calculated by the diameter measuring apparatus to be automatically collected and managed and further allows a correction amount of the diameter correction coefficient required to calculate the first diameter to be automatically calculated.

In the present invention, the database server preferably corrects the diameter measurement position at which the single crystal pulling-up apparatus performs measurement using a crystal length correction coefficient considering thermal expansion of the single crystal and calculates a correction amount of the diameter correction coefficient from the first and second diameters measured at diameter measurement positions which coincide with each other using the corrected diameter measurement position. This can accurately calculate the diameter correction coefficient based on the first and second diameters to thereby correct the diameter measurement value.

A single crystal manufacturing method according to the present invention includes a single crystal pulling-up step of calculating a diameter measurement value of a single crystal from an image photographed by a camera during a pulling-up process of the single crystal according to a CZ method, calculating a first diameter of the single crystal by correcting the diameter measurement value using a diameter correction coefficient, and controls crystal pulling-up conditions based on the first diameter; a diameter measurement step of measuring, under room temperature, a diameter of the single crystal pulled up in the silicon crystal pulling-up step to calculate a second diameter of the single crystal; and a management step of acquiring the first and second diameters and managing them. The managing step includes a diameter correction coefficient correction step of calculating a correction amount of the diameter correction coefficient from the first and second diameters obtained at diameter measurement positions which coincide with each other under room temperature and correcting the diameter correction coefficient using the calculated correction amount.

According to the present invention, the first diameter that the single crystal pulling-up step calculates for crystal pulling-up control and the second diameter that the diameter measurement step calculates for accurate measurement of the crystal diameter can be automatically collected, and a correction amount of the diameter correction coefficient can be automatically calculated from the first and second diameter values. This can prevent mistakes in the calculation of the correction amount due to operator's manual calculation and mistakes in the setting thereof, thereby allowing an adequate correction amount to be reflected in the next batch.

Effects of the Invention

According to the present invention, there can be provided a single crystal manufacturing system and method capable of preventing calculation and setting mistakes with respect to the correction amount and reflecting an adequate correction amount in the next batch.

MODE FOR CARRYING OUT THE INVENTION

Hereinafter, preferred embodiments of the present invention will be described in detail with reference to the accompanying drawings.

Figure 1:
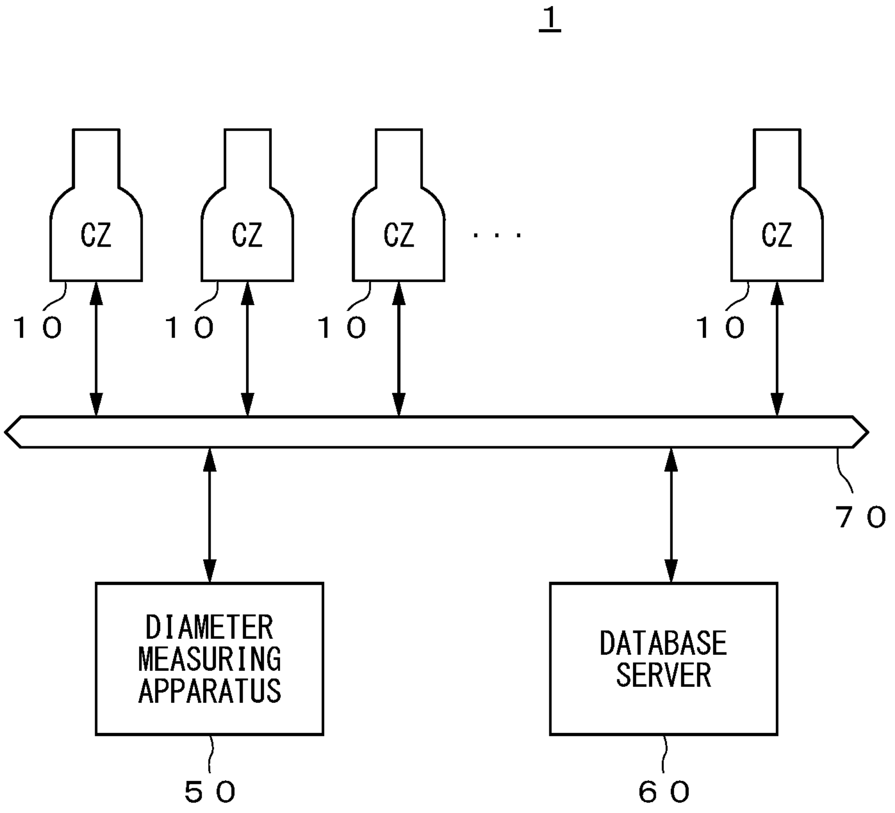
FIG. 1 is a block diagram illustrating the entire configuration of a single crystal manufacturing system according to an embodiment of the present invention.

FIG. 1 is a block diagram illustrating the entire configuration of a single crystal manufacturing system according to an embodiment of the present invention.

As illustrated in FIG. 1, a single crystal manufacturing system 1 includes a plurality of single crystal pulling-up apparatuses 10 in which a silicon single crystal is pulled up by the CZ method, a diameter measuring apparatus 50 for measuring, under room temperature, the diameter of a silicon single crystal ingot pulled up by each of the plurality of single crystal pulling-up apparatuses 10, and a database server 60 for managing data related to the silicon single crystal ingot. The plurality of single crystal pulling-up apparatuses 10 and the diameter measuring apparatus 50 are connected to the database server 60 over a communication network 70 so as to be communicable to each other.

The single crystal pulling-up apparatus 10 is a known apparatus for producing a silicon single crystal according to the CZ method. Although details will be described later, the single crystal pulling-up apparatus 10 measures various physical quantities during a single crystal pulling-up process, and the measured values are used for control of the single crystal pulling-up and sent to a database server 60 over the communication network 70 so as to be managed. Further, the single crystal pulling-up apparatus 10 grows a silicon single crystal while controlling a crystal pulling-up rate and heater power so as to keep the diameter of the silicon single crystal constant. To this end, during the crystal pulling-up process, the boundary between a single crystal and a melt is photographed with a camera, the actual diameter of the single crystal is estimated from the diameter of a fusion ring appearing on a solid-liquid interface, and diameter control for the silicon single crystal is performed based on the estimated diameter. Further, the single crystal pulling-up apparatus 10 uses a diameter correction coefficient provided from the database server 60 to correct a diameter measurement value of the silicon single crystal measured under high temperature during the crystal pulling-up process to a diameter (first diameter) observed under room temperature and performs the crystal diameter control based on the corrected diameter.

The silicon single crystal ingot pulled up by the single crystal pulling-up apparatus 10 is conveyed to the diameter measuring apparatus 50, and the diameter measuring apparatus 50 measures a diameter (second diameter) of the silicon single crystal ingot under room temperature. The obtained diameter data is sent to the database server 60 over the communication network 70 and managed thereby.

The database server 60, which is a computer having a database function, manages data related to a silicon single crystal ingot provided from the plurality of single crystal pulling-up apparatuses 10 and manages diameter data of a silicon single crystal ingot measured by the diameter measuring apparatus 50 and the data related to a silicon single crystal ingot provided from the plurality of single crystal pulling-up apparatuses 10 in association with each other. Further, the database server 60 manages the diameter correction coefficient required for calculating a crystal diameter from an image photographed by the camera of the single crystal pulling-up apparatus 10 and calculates the diameter correction coefficient based on the difference between diameter data of a silicon single crystal ingot that the single crystal pulling-up apparatus 10 measures during the crystal pulling-up process and diameter data of the silicon single crystal ingot that the diameter measuring apparatus 50 actually measures under room temperature. The diameter correction coefficient is sent to a corresponding one of the single crystal pulling-up apparatuses 10 and used for correcting the diameter measurement value of the silicon single crystal that the single crystal pulling-up apparatus 10 calculates from the camera photographed image during the crystal pulling-up process.

Figure 2:
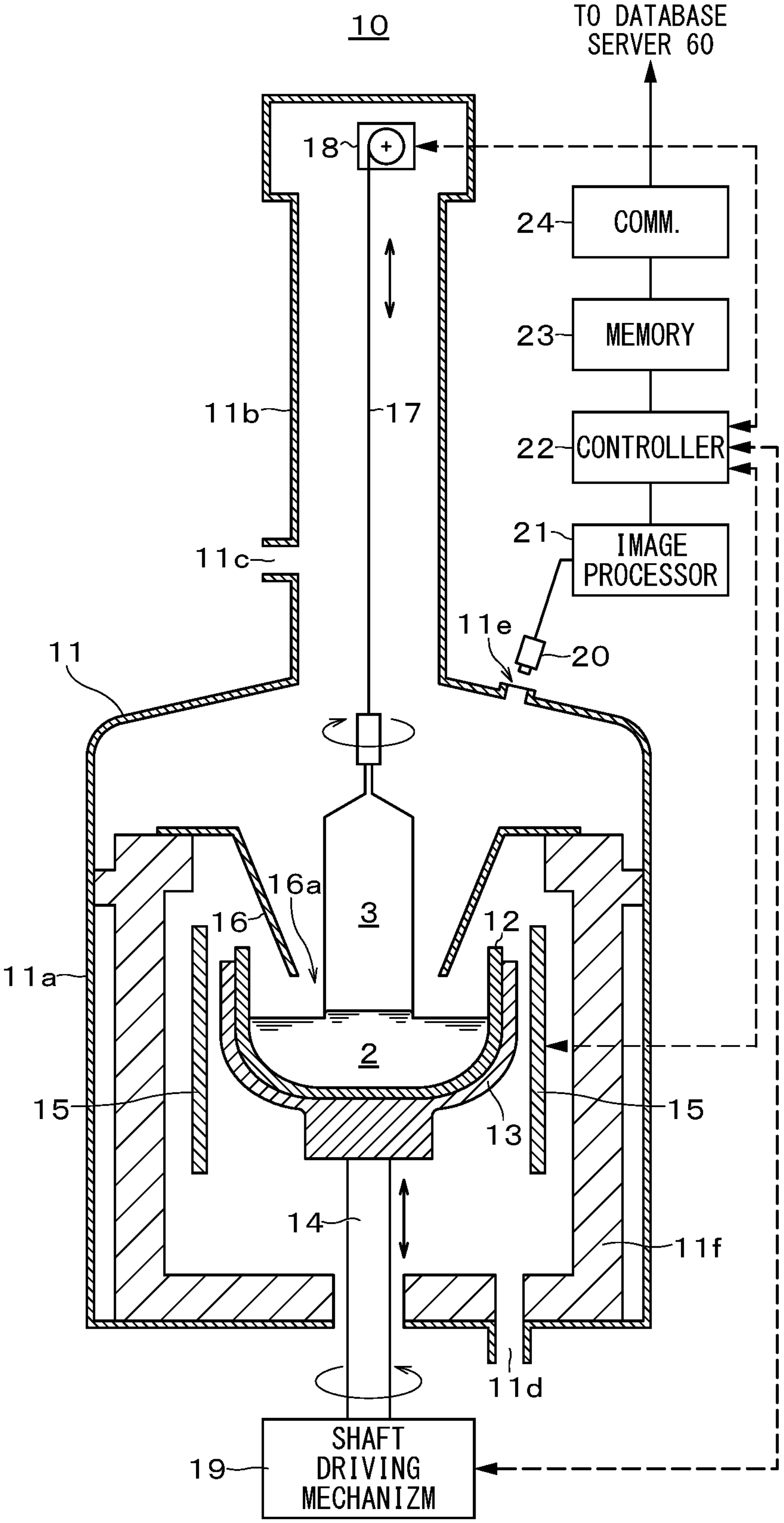
FIG. 2 is a cross-sectional side view schematically illustrating the configuration of the single crystal pulling-up apparatus.

FIG. 2 is a cross-sectional side view schematically illustrating the configuration of the single crystal pulling-up apparatus 10.

As illustrated in FIG. 2, the single crystal pulling-up apparatus 10 includes a water-cooled chamber 11, a quartz crucible 12 that holds a silicon melt 2 in the chamber 11, a graphite crucible 13 that supports the quartz crucible 12, a rotary shaft 14 that supports the graphite crucible 13, a heater 15 disposed so as to surround the graphite crucible 13, a heat shield 16 disposed above the quartz crucible 12, a pulling-up wire 17 serving as a crystal pulling-up axis and disposed above the quartz crucible 12 so as to be coaxial with the rotary shaft 14, a crystal pulling-up mechanism 18 disposed at the upper portion of the chamber 11, and a shaft driving mechanism 19 that rotates and lifts/lowers the quartz crucible 12 through the rotary shaft 14 and graphite crucible 13.

The single crystal pulling-up apparatus 10 further includes a camera 20 for photographing the inside of the chamber 11, an image processor 21 processing an image photographed by the camera 20, a controller 22 controlling the components in the single crystal pulling-up apparatus 10, a memory 23 for storing therein various physical quantities measured during the crystal pulling-up process, and a communication part 24 transmitting data stored in the memory 23 to the database server 60.

The chamber 11 is constituted of a main chamber 11*a* and an elongated cylindrical pull chamber 11*b* connected to an upper opening of the main chamber 11*a*, and the quartz crucible 12, graphite crucible 13, heater 15, and heat shield 16 are provided inside the main chamber 11*a*. A gas inlet 11*c* for introducing inert gas (purge gas) such as argon gas and dopant gas into the chamber 11 is formed in the pull chamber 11*b*, and a gas outlet 11*d* for discharging atmospheric gas from the chamber 11 is formed at the lower part of the main chamber 10*a*. Further, an observation window 11*e* is formed at the upper portion of the main chamber 1*a* to allow a growing status of a silicon single crystal 3 to be observed therethrough.

The quartz crucible 12 is a silica glass container having a cylindrical side wall part and a bottom part. The graphite crucible 13 tightly contacts the outer surface of the quartz crucible 12 to cover and hold the quartz crucible 12 so as to maintain the shape of the quartz crucible 12 soften by heating. The quartz crucible 12 and graphite crucible 13 constitute a double-structured crucible that supports the silicon melt 2 in the chamber 11.

The graphite crucible 13 is fixed to the upper end portion of the rotary shaft 14. The lower end portion of the rotary shaft 14 penetrates the bottom part of the chamber 11 to be connected to the shaft driving mechanism 19 provided outside the chamber 11. The graphite crucible 13, rotary shaft 14, and shaft driving mechanism 19 constitute a rotary mechanism and a lifting/lowering mechanism for the quartz crucible 12. Rotation and lifting/lowering operations of the quartz crucible 12 driven by the shaft driving mechanism 19 are controlled by the controller 22.

The heater 15 is used to melt a silicon raw material filled in the quartz crucible 12 to generate the silicon melt 2 and maintain the molten state thereof. The heater 15 is a resistance heating type heater made of carbon and is provided so as to surround the quartz crucible 12 in the graphite crucible 13. The heater 15 is surrounded by a heat insulating material 11*f*, whereby heat retention performance inside the chamber 11 can be enhanced. The power of the heater 15 is controlled by the controller 22.

The heat shield 16 provides an adequate heat distribution around a crystal growth interface by suppressing a temperature variation of the silicon melt 2 and prevents the silicon single crystal 3 from being heated by radiation heat from the heater 15 and quartz crucible 12. The heat shield 16 is a substantially cylindrical graphite member covering an area above the silicon melt 2 excluding a pulling-up path for the silicon single crystal 3.

The lower end opening of the heat shield 16 has a diameter larger than that of the silicon single crystal 3, thereby ensuring the pulling-up path for the silicon single crystal 3. Further, the lower end portion of the heat shield 16 has an outer diameter smaller than the opening diameter of the quartz crucible 12 and is positioned inside the quartz crucible 12, so that even when the rim upper end of the quartz crucible 12 is lifted exceeding the lower end of the heat shield 16, the heat shield 16 does not interfere with the quartz crucible 12.

The amount of melt in the quartz crucible 12 decreases with the growth of the silicon single crystal 3; however, by lifting the quartz crucible 12 so as to keep a gap between the melt surface and the heat shield 16 constant, it is possible to enhance stability of crystal defect distribution, oxygen concentration distribution, resistivity distribution, etc., in the pulling-up axis direction of the silicon single crystal 3.

The pulling-up wire 17 serving as the pulling-up axis of the silicon single crystal 3 and crystal pulling-up mechanism 18 for lifting the silicon single crystal 3 by winding the pulling-up wire 17 are provided above the quartz crucible 12. The crystal pulling-up mechanism 18 has a function of rotating the silicon single crystal 3 with the pulling-up wire 17. The crystal pulling-up mechanism 18 is controlled by the controller 22. The crystal pulling-up mechanism 18 is provided at the upper portion of the pull chamber 11*b*. The pulling-up wire 17 extends downward from the crystal pulling-up mechanism 18, passing through the pull chamber 11*b* until the leading end thereof reaches the inner space of the main chamber 11*a*. FIG. 2 illustrates a state where the silicon single crystal 3 being grown is suspended on the pulling-up wire 17. Upon pulling-up of the silicon single crystal 3, the pulling-up wire 17 is gradually pulled up while the quartz crucible 12 and silicon single crystal 3 are being rotated to grow the silicon single crystal 3. The crystal pulling-up rate is controlled by the controller 22.

The camera 20 is installed outside the chamber 11. The camera 20 is, for example, a CCD camera and photographs the inside of the chamber 11 through the observation window 11*e* formed in the chamber 11. The camera 20 is installed at a predetermined angle with respect to the vertical direction and thus has an optical axis inclined with respect to the pulling-up axis of the silicon single crystal 3. That is, the camera 20 photographs the opening of the heat shield 16, the liquid surface of the silicon melt 2, and the single crystal from obliquely upward.

The camera 20 is connected to the image processor 21, and the image processor 21 is connected to the controller 22. The image processor 21 calculates a crystal diameter around the solid-liquid interface from the contour pattern of a single crystal appearing in the photographed image of the camera 20.

The controller 22 controls the crystal pulling-up rate based on the crystal diameter data acquired from the photographed image of the camera 20 to control the crystal diameter. Specifically, when the measured value of the crystal diameter is larger than a target diameter, the crystal pulling-up rate is increased; while when the measured value of the crystal diameter is smaller than a target diameter, the crystal pulling-up rate is reduced. Further, the controller 22 controls the moving amount (crucible lifting rate) of the quartz crucible 12 based on crystal length data of the silicon single crystal 3 acquired from a sensor of the crystal pulling-up mechanism 18 and the crystal diameter data acquired from the photographed image of the camera 20.

The following describes a method of measuring the diameter of the silicon single crystal 3. In order to control the diameter of the silicon single crystal 3 during the pulling-up of the silicon single crystal 3, an image of the boundary portion between the silicon single crystal 3 and the melt surface is photographed by the camera 20, and the diameter of the silicon single crystal 3 is calculated from the center position of a fusion ring generated at the boundary portion and the distance between two luminance peaks of the fusion ring. Further, in order to control the liquid surface of the silicon melt 2, a liquid surface position is calculated from the center position of the fusion ring. The controller 22 controls pulling-up conditions such as pulling-up rate of the wire 17, power of the heater 15, and rotation speed of the quartz crucible 12 such that the diameter of the silicon single crystal 3 becomes a target diameter. Further, the controller 22 controls the height position of the quartz crucible 12 so as to set the liquid surface position to a desired position.

Figure 3:
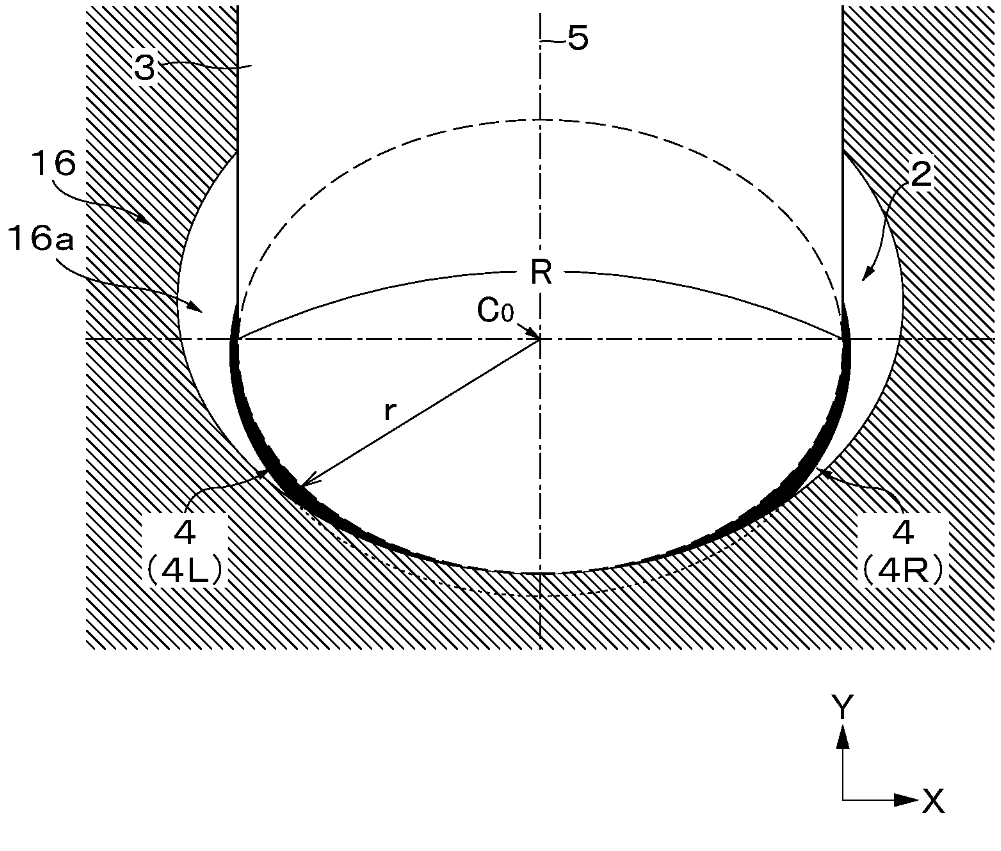
FIG. 3 is a perspective view schematically illustrating an image of the boundary portion between the silicon single crystal and the silicon melt photographed by the camera.

FIG. 3 is a perspective view schematically illustrating an image of the boundary portion between the silicon single crystal 3 and the silicon melt 2 photographed by the camera 20.

As illustrated in FIG. 3, the image processor 21 calculates a radius r and a diameter R=2r of a fusion ring 4 generated at the boundary portion between the silicon single crystal 3 and the silicon melt 2 from the coordinate position of a center $C_0$ of the fusion ring 4 and the coordinate position of any one point on the fusion ring 4. That is, the image processor 21 calculates the diameter R of the silicon single crystal 3 at the solid-liquid surface. The position of the center C0 of the fusion ring 4 coincides with the intersection between an extension line 5 of the pulling-up axis of the silicon single crystal 3 and the melt surface.

The camera 20 photographs the boundary portion between the silicon single crystal 3 and the melt surface from obliquely upward and thus cannot capture the fusion ring 4 as a true circle. However, when the camera 20 is accurately installed at a designed position at a designed angle, a substantially ellipsoidal fusion ring 4 can be corrected to a true circle based on a viewing angle with respect to the melt surface, thus allowing the diameter of the fusion ring 4 to be geometrically calculated from the corrected fusion ring 4.

The fusion ring 4 is a high luminance zone formed by light reflected at the meniscus, which is generated at the entire periphery of the silicon single crystal 3; however, the fusion ring 4 on the back side of the silicon single crystal 3 cannot be viewed through the observation window 11*e*. Further, when the fusion ring 4 is observed through a gap between an opening 16*a* of the heat shield 16 and the silicon single crystal 3, a part of the fusion ring 4 that is positioned on the nearest side (lower side in FIG. 3 in the viewing direction may be hidden behind the heat shield 16 and invisible, if the diameter of the silicon single crystal 3 is large. In this case, only a part 4L on the front left and a part 4R on the front right in the viewing direction can be viewed. According to the present invention, even when only a part of the fusion ring 4 can be observed, the diameter of the fusion ring 4 can be calculated from the visible part.

As described above, the single crystal pulling-up apparatus 10 has the camera 20 for photographing the inside of the chamber 11, estimates the diameter of the silicon single crystal 3 around the solid-liquid interface from the photographed image of the camera 20, and controls the crystal pulling-up conditions such as a pulling-up rate, etc. such that the diameter of the silicon single crystal 3 becomes a desired diameter (e.g., 305 mm to 320 mm for a 300 mm wafer).

A silicon single crystal during the single crystal pulling-up process thermally expands under high temperature, so that the diameter of the silicon single crystal is larger than the diameter when the silicon single crystal is taken out of the chamber 11 and then cooled down. When the diameter control for the silicon single crystal is performed based on the diameter of the thermally expanding crystal, it is difficult to perform the diameter control such that the crystal diameter under room temperature becomes a target diameter. Thus, in the diameter control for the silicon single crystal during the single crystal pulling-up process, the diameter of the silicon single crystal under high temperature appearing in the photographed image of the camera 20 is converted into a diameter value under room temperature, and the crystal growth conditions such as a crystal pulling-up rate are controlled based on the crystal diameter value under room temperature. The reason that the crystal pulling-up conditions are controlled based on the crystal diameter value under room temperature is that management of the crystal diameter under room temperature is important. That is, the diameter adjusted to a target diameter under high temperature may be reduced below the target diameter when the silicon single crystal is set back to room temperature, resulting in a defective product. Thus, the diameter control is performed such that the crystal diameter under room temperature becomes a target diameter.

As described above, the diameter measurement value during the crystal pulling-up process is obtained under high temperature and includes an error due to, at least, thermal expansion. Therefore, it is necessary to identify the measurement error with respect to the diameter of a silicon single crystal ingot that has actually been pulled up and correct the identified error. Thus, the silicon single crystal ingot that has actually been pulled up by the single crystal pulling-up apparatus 10 is accurately measured for its crystal diameter under room temperature.

Figure 4:
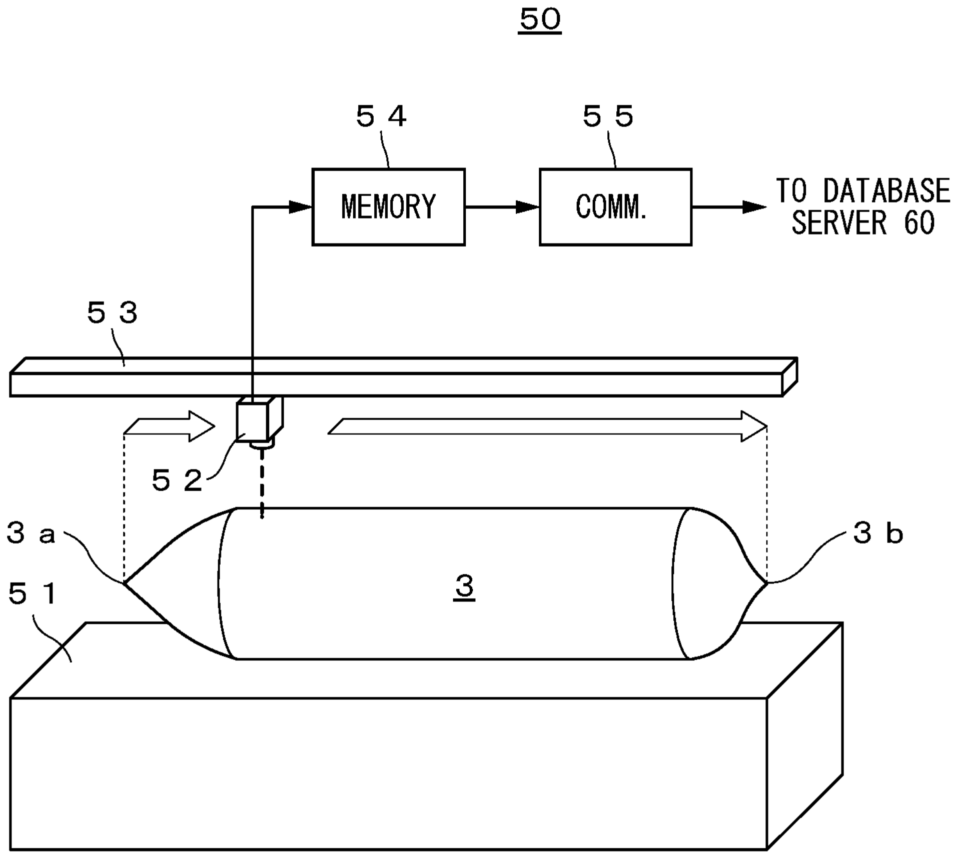
FIG. 4 is a schematic view illustrating an example of the configuration of the diameter measuring apparatus.

FIG. 4 is a schematic view illustrating an example of the configuration of the diameter measuring apparatus 50.

As illustrated in FIG. 4, the diameter measuring apparatus 50 has a stage 51 on which the silicon single crystal ingot 3 is placed, a laser range finder 52 for measuring the diameter of the silicon single crystal ingot 3 on the stage 51, a slide mechanism 53 that slides the laser range finder 52 along the crystal longitudinal direction of the silicon single crystal ingot 3, a memory 54 that stores diameter data obtained by the laser range finder 52 and a diameter measurement position at which the diameter data is obtained, and a communication part 55 that transmits the diameter data in the memory 54 to the database server 60. The diameter data of the silicon single crystal ingot 3 is transmitted to the database server 60 together with an ID of the measured ingot and the diameter measurement position data in the crystal longitudinal direction. The diameter of the silicon single crystal ingot 3 is measured, for example, from a leading end 3*a* of the silicon single crystal ingot 3 to a trailing end 3*b* at 10 mm intervals, and the obtained diameter data is stored in the memory 54 in the form of a data table associated with the ingot ID and diameter measurement position data. Thereafter, the data table in the memory 54 is transferred from the communication part 55 to the database server 60.

The database server 60 stores the data table including the diameter data of the silicon single crystal ingot 3 transmitted from the diameter measuring apparatus 50 in association with the diameter data of the corresponding silicon single crystal ingot 3 that has already been acquired from the single crystal pulling-up apparatus 10. Then, the database server 60 compares the diameter data (first diameter) that has been measured by the single crystal pulling-up apparatus 10 and the diameter data (second diameter) that has actually been measured under room temperature by the diameter measuring apparatus 50 to calculate an error therebetween, calculates a correction amount $\Delta\alpha$ for a diameter correction coefficient $\alpha$ from the diameter measurement error, and uses the correction amount $\Delta\alpha$ to correct the diameter correction coefficient $\alpha$ used for correction of the diameter measurement value.

The silicon single crystal during the single crystal pulling-up process thermally expands not only in the radial direction thereof but also in the longitudinal direction. Accordingly, when the ingot is taken out of a furnace after completion of the crystal pulling-up and measured under room temperature, an error in the crystal length also occurs. Thus, to make the diameter measurement position during the single crystal pulling-up process and the diameter measurement position under room temperature coincide with each other to make the above two positions equivalent to each other, the diameter measurement position needs to be corrected in consideration of an increase in the length of the single crystal in the longitudinal direction due to thermal expansion. For correction of the diameter measurement position, a previously prepared crystal length correction coefficient $\beta$ is used. A reference position (origin) of the diameter measurement position may be set to a start position (straight body part start position) of the straight body part (constant diameter part) of a single crystal or a dipping position (crystal pulling-up start position) of a seed crystal.

Figure 5:
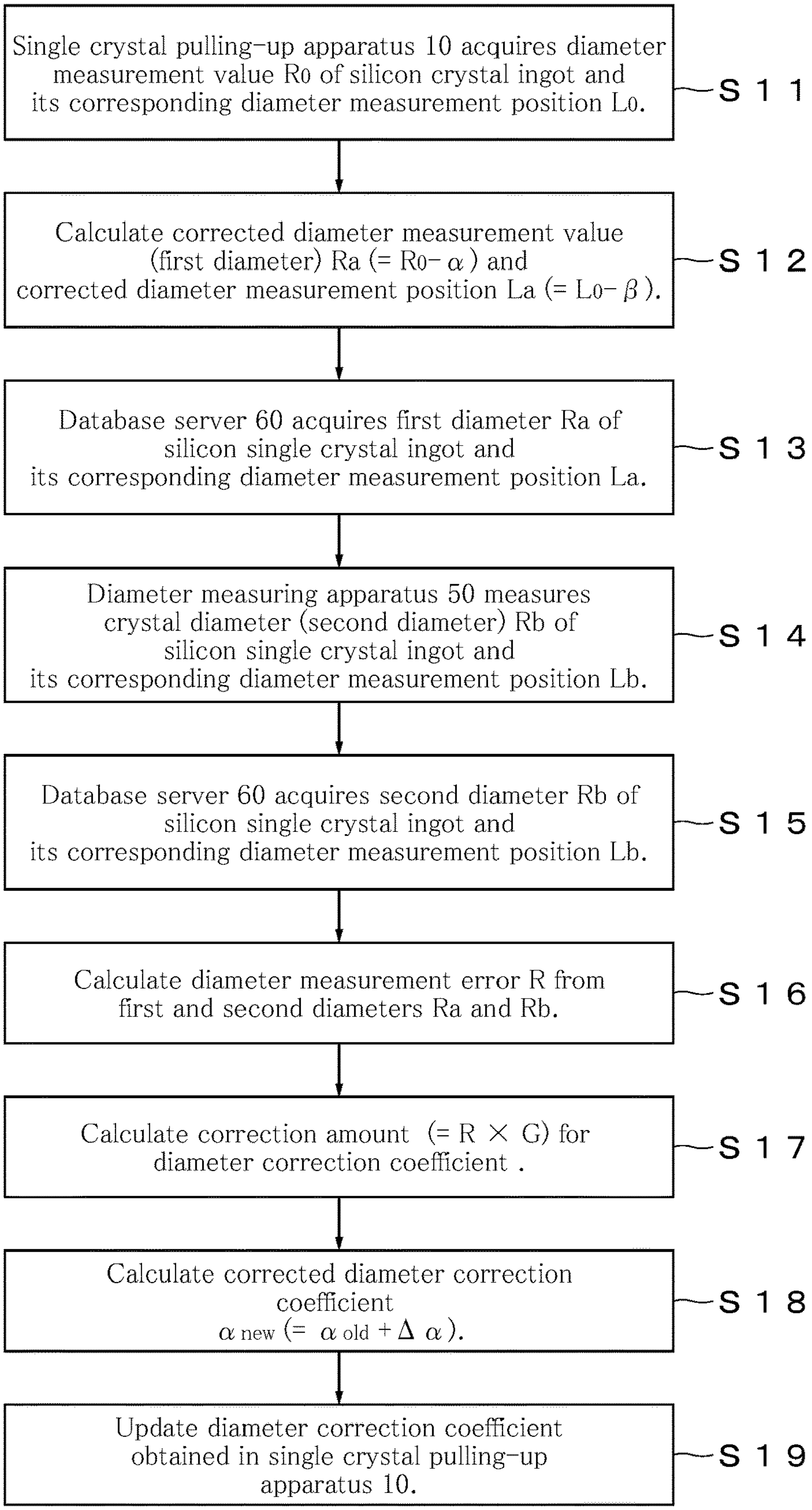
FIG. 5 is a flowchart explaining a correction method for the diameter correction coefficient.

FIG. 5 is a flowchart explaining a correction method for the diameter correction coefficient $\alpha$.

As illustrated in FIG. 5, the single crystal pulling-up apparatus 10 acquires a diameter measurement value R0 calculated from an image that the camera 20 photographs during the crystal pulling-up process and a diameter measurement position $L_0$ in the crystal longitudinal direction at which the diameter measurement value $R_0$ is obtained (step S11).

Then, considering that the diameter measurement value R0 and diameter measurement position $L_0$ are calculated from a single crystal that has expanded under high temperature, the diameter correction coefficient $\alpha$ is used to correct the diameter measurement value $R_0$ to calculate a crystal diameter Ra ($=R_0-\alpha$) under room temperature (step S12). Further, the diameter measurement position $L_0$ is also corrected to a value obtained by removing the influence of thermal expansion, whereby a diameter measurement position La ($=L_0-\beta$) under room temperature is obtained (step S12). Although the diameter measurement position La under room temperature and the diameter measurement position $L_0$ during the crystal pulling-up process differ from each other by a value ($=\beta$) corresponding to thermal expansion, they are the same position under room temperature. In this way, the crystal diameter Ra (first diameter) under room temperature measured during the crystal pulling-up process and the diameter measurement position La in the crystal longitudinal direction are calculated. Based on the thus obtained crystal diameter Ra, the single crystal diameter control is performed.

During the crystal pulling-up process, the crystal diameter Ra is measured in the crystal longitudinal direction at, e.g., 1 mm intervals and then transmitted to and stored in the database server 60 together with the corresponding diameter measurement position La. That is, the database server 60 acquires the crystal diameter Ra corrected using the diameter correction coefficient α and the diameter measurement position La corrected using the crystal length correction coefficient β (step S13). After completion of the crystal pulling-up process, the silicon single crystal ingot 3 is cooled down and taken out of the single crystal pulling-up apparatus 10.

Then, the diameter measuring apparatus 50 measures the crystal diameter of the silicon single crystal ingot 3 under room temperature (step S14). As described above, the laser range finder 52 is used to measure the crystal diameter under room temperature with high accuracy. In this way, the crystal diameter Rb (second diameter) and its corresponding diameter measurement position Lb in the crystal longitudinal direction are calculated. The crystal diameter Rb is also measured in the crystal longitudinal direction at, e.g., 1 mm intervals and then transmitted to and stored in the database server 60 together with the corresponding diameter measurement position Lb. That is, the database server 60 acquires the crystal diameter Rb and its corresponding diameter measurement position Lb (step S15).

The database server 60 manages the crystal diameter data transmitted from the single crystal pulling-up apparatus 10 and that transmitted from the diameter measuring apparatus 50 in association with each other and uses the crystal diameter Ra and crystal diameter Rb measured respectively at the crystal longitudinal positions La and Lb which coincide with each other under room temperature to calculate a diameter measurement error ΔR (step S16). The diameter measurement error ΔR may be calculated as the difference between the two crystal diameters (ΔR=Ra−Rb) or as the ratio between the two crystal diameters (ΔR=Ra/Rb).

Then, the diameter measurement error ΔR is multiplied by a predetermined gain G ($0<G\leq1$) to calculate the correction amount Δα (=ΔR×G) for the diameter correction coefficient α (step S17). When the diameter measurement error ΔR is not multiplied by the gain G which is larger than 0 and equal to or less than 1, the error ΔR may become large and diverges while the diameter measurement value $R_0$ is repeatedly corrected using the diameter correction coefficient α. To multiply the gain G which is larger than 0 and equal to or less than 1 is effective to stably keep the diameter measurement error ΔR to a small value. The diameter measurement error ΔR is usually very small, and thus the gain G is preferably equal to or less than 0.5. Then, the correction amount Δα is added to the current diameter correction coefficient α to calculate a corrected diameter correction coefficient α (=α+Δα) (step S18). That is, assuming that the diameter correction coefficients before and after correction are $\alpha_{old}$ and anew, respectively, $\alpha_{new}=\alpha_{old}+\Delta\alpha$ is satisfied. The diameter correction coefficient $\alpha_{new}$ thus obtained is transmitted from the database server 60 to its corresponding single crystal pulling-up apparatus 10, where the existing diameter correction coefficient is updated with the diameter correction coefficient $\alpha_{new}$ and is used for correction calculation for the crystal diameter in the next batch (step S19). That is, the diameter correction coefficient $\alpha_{new}$ is used for calculating the corrected diameter measurement value $Ra=R_0-\alpha$.

Figure 6A:
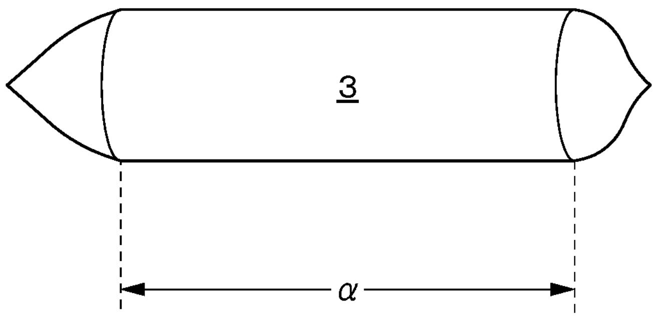
FIGS. 6A and 6B are schematic views each illustrating the correspondence between the longitudinal direction position in the silicon single crystal ingot and the diameter correction coefficient α.
Figure 6B:
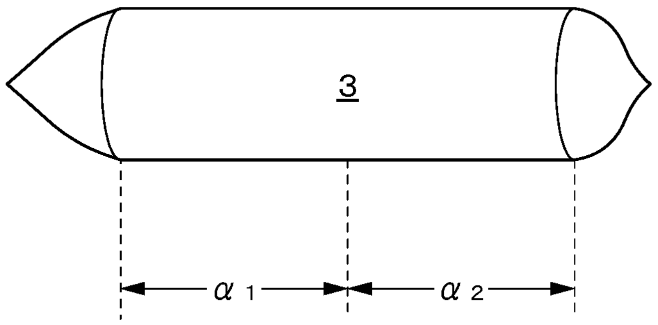

FIGS. 6A and 6B are schematic views each illustrating the correspondence between the longitudinal direction position in the silicon single crystal ingot and the diameter correction coefficient α.

The diameter correction coefficient α for correction of the crystal diameter that the single crystal pulling-up apparatus 10 measures during the crystal pulling-up process may be the same across the entire length of the ingot as illustrated in FIG. 6A, or may be set for each section in the crystal longitudinal direction as illustrated in FIG. 6B. In the former case, a value obtained by multiplying the average value of the diameter measurement errors ΔR in all sections by the gain G can be set as the correction amount Δα for diameter correction coefficient α. In the latter case, the average value of the diameter measurement errors ΔR is calculated for each section of the corresponding diameter correction coefficient and multiplied by the gain G, whereby the correction values Δα having different values in the crystal longitudinal direction can be calculated as a correction amount $\Delta\alpha_1$ for a diameter correction coefficient ai and a correction amount $\Delta\alpha_2$ for a diameter correction coefficient $\alpha_2$.

The error in the crystal diameter that the single crystal pulling-up apparatus 10 measures during the crystal pulling-up process may significantly vary depending on the longitudinal direction position of the single crystal due to a variation in the luminance state of the fusion ring 4 in the longitudinal direction of the single crystal. Thus, by making the diameter correction coefficient different between the front and rear halves of the signal crystal in the longitudinal direction as illustrated in, for example, FIG. 6B, it is possible to increase diameter correction accuracy. Although the single crystal is divided into two sections in the example of FIG. 6B, it may be divided into three or more sections.

Although the correction for the diameter correction coefficient α need not necessarily be performed every batch, it is preferably performed periodically. This is because, in the single crystal pulling-up process according to the CZ method, the diameter of the single crystal being pulled up is measured using the camera 20, and the diameter measurement value is susceptible to a slight change in the furnace. For example, an insulating material gradually deteriorates to change thermal distribution in the furnace, leading to a change in luminance distribution in the meniscus appearing in the photographed image of the camera, which in turn changes the diameter measurement value. Therefore, it is desirable to periodically correct the diameter correction coefficient α according to the usage of the single crystal pulling-up apparatus 10.

As described above, in the single crystal manufacturing system 1 according to the present embodiment, the crystal diameter of a silicon single crystal measured from an image of the silicon single crystal that the camera 20 of the single crystal pulling-up apparatus 10 photographs during the crystal pulling-up process and the crystal diameter of the silicon single crystal that the diameter measuring apparatus 50 measured under room temperature after completion of the crystal pulling-up process are stored in the database server 60. The database server 60 then calculates the diameter measurement error ΔR based on the stored crystal diameters, corrects the diameter correction coefficient based on the diameter measurement error ΔR, and sets the corrected diameter correction coefficient in the single crystal pulling-up apparatus. This allows the single crystal pulling-up apparatus 10 to correct the diameter measurement value using the new diameter correction coefficient in the next batch.

Further, in the present embodiment, to calculate the new diameter correction coefficient, the database server 60 corrects the existing diameter correction coefficient using a correction amount obtained by multiplying the diameter measurement error between the corrected diameter measurement value and the actually measured diameter by the gain. This can suppress an excessive variation in the diameter correction coefficient to stably correct the crystal diameter.

Further, in the present embodiment, the database server 60 compares, based on the diameter measurement position corrected in consideration of the influence of thermal expansion, the corrected diameter measurement value (first diameter) and the actually measured diameter (second diameter) which are obtained at the diameter measurement positions coinciding with each other under room temperature. This can correct the diameter measurement value accurately.

While the preferred embodiment of the present invention has been described, the present invention is not limited to the above embodiment, and various modifications may be made within the scope of the present invention, and all such modifications are included in the present invention.

For example, although manufacturing of the silicon single crystal has been taken as an example, the present invention is not limited to this, but may be applied to manufacturing of various single crystals grown by the CZ method.

REFERENCE SIGNS LIST

1: Single crystal manufacturing system
2: Silicon melt
3: Silicon single crystal (ingot)
3*a*: Leading end of silicon single crystal ingot
3*b*: Trailing end of silicon single crystal ingot
4: Fusion ring
4L, 4R: Part of fusion ring
5: Extension line of pulling-up axis
10: Single crystal pulling-up apparatus
11: Chamber
11*a*: Main chamber
11*b*: Pull chamber
11*c*: Gas inlet
11*d*: Gas outlet
11*e*: Observation window
11*f*: Heat insulating material
12: Quartz crucible
13: Graphite crucible
14: Rotary shaft
15: Heater
16: Heat shield
16*a*: Opening
17: Pulling-up wire
18: Crystal pulling-up mechanism
19: Shaft driving mechanism
20: Camera
21: Image processor
22: Controller
23: Memory
24: Communication part
30: Database server
50: Diameter measuring apparatus
51: Stage
52: Laser range finder
53: Slide mechanism
54: Memory
55: Communication part
60: Database server
70: Communication network

What is claimed:

1. A single crystal manufacturing system comprising:

a single crystal pulling-up apparatus comprising a chamber, a heater, a crucible, a pulling-up mechanism for a crystal, a camera, and a rotating mechanism that rotates the crucible while being heated in the chamber, the single crystal pulling-up apparatus calculates a diameter measurement value of a growing single crystal during a pulling-up process of the growing single crystal according to a CZ method, calculates a first diameter of the growing single crystal by correcting the diameter measurement value using a diameter correction coefficient, and controls a diameter of the growing single crystal based on the first diameter;

a diameter measuring apparatus that measures, under room temperature, a diameter of a previous single crystal pulled up by the single crystal pulling-up apparatus to calculate a second diameter; and a database server that acquires the first diameter and the second diameter from the single crystal pulling-up apparatus and the diameter measuring apparatus, respectively, and manages them, wherein the database server calculates a correction amount of the diameter correction coefficient from the first and second diameters obtained at diameter measurement positions which coincide with each other under room temperature and corrects the diameter correction coefficient using the calculated correction amount, the database server corrects the diameter measurement position of the growing single crystal in a longitudinal direction due to thermal expansion to coincide with a diameter measurement position of the previous single crystal at room temperature;

the database server transmits the calculated correction amount to the pulling-up apparatus; and the pulling-up apparatus updates the diameter correction coefficient to grow a single crystal.

2. The single crystal manufacturing system according to claim 1, wherein the crystal pulling-up apparatus has a camera photographing a boundary between the growing single crystal and a melt during the single crystal pulling-up process and calculates the diameter measurement value of the growing single crystal from a photographed image of the camera.

3. The single crystal manufacturing system according to claim 1, wherein the database server sets the diameter correction coefficient after being corrected in the single crystal pulling-up apparatus, and the single crystal pulling-up apparatus corrects a diameter measurement value of a single crystal in the next batch using the corrected diameter correction coefficient.

4. The single crystal manufacturing system according to claim 1, wherein the correction amount of the diameter correction coefficient is a value obtained by multiplying the difference or ratio between the first and second diameters obtained at diameter measurement positions which coincide with each other under room temperature by a gain, and the gain is more than 0 and equal to or less than 1.

5. The single crystal manufacturing system according to claim 1, wherein the single crystal pulling-up apparatus and the diameter measuring apparatus are connected to the database server over a communication network, the single crystal pulling-up apparatus transmits the first diameter of the growing single crystal, a diameter measurement position at which the first diameter is measured, and an ingot ID of the growing single crystal to the database server, the diameter measuring apparatus transmits the second diameter of the previous single crystal, a diameter measurement position at which the second diameter is measured, and an ingot ID of the single crystal to the database server, the database server registers the first diameter from the single crystal pulling-up apparatus and the second diameter from the diameter measuring apparatus in association with each other.

6. The single crystal manufacturing system according to claim 1, wherein the database server corrects the diameter measurement position at which the single crystal pulling-up apparatus performs measurement using a crystal length correction coefficient considering thermal expansion of the growing single crystal, and calculates a correction amount of the diameter correction coefficient from the first and second diameters measured at diameter measurement positions which coincide with each other using the corrected diameter measurement position.

7. A single crystal manufacturing method comprising:

heating a polysilicon raw material in a crucible to generate a silicon melt;

pulling up a seed crystal while being rotated together with the crucible which grows a single crystal;

photographing a liquid surface of the silicon melt and the growing single crystal and creating an image;

calculating a diameter measurement value of the growing single crystal from the image;

calculating a first diameter of the growing single crystal by correcting the diameter measurement value using a diameter correction coefficient, and controlling a crystal diameter based on the first diameter;

a diameter measurement step of measuring, under room temperature, a diameter of a single crystal previously pulled up to calculate a second diameter; and a management step of acquiring the first and second diameters and managing them, wherein the managing step includes a diameter correction coefficient correction step of calculating a correction amount of the diameter correction coefficient from the first and second diameters obtained at diameter measurement positions which coincide with each other under room temperature, comprising correcting the diameter measurement position of the growing single crystal in the longitudinal direction due to thermal expansion to coincide with the diameter measurement position of the previous single crystal at room temperature, and correcting the diameter correction coefficient using the calculated correction amount; and controlling the rate of pulling up the growing single crystal based on a crystal diameter value converted into a diameter value under room temperature.

8. The single crystal manufacturing method according to claim 7, wherein the managing step corrects the diameter measurement position at which the single crystal pulling-up apparatus performs measurement using a crystal length correction coefficient considering thermal expansion of the growing single crystal, and calculates a correction amount of the diameter correction coefficient from the first and second diameters measured at diameter measurement positions which coincide with each other using the corrected diameter measurement position.

* * * * *